United States Patent [19]

Sadhir

[11] Patent Number: 5,428,840
[45] Date of Patent: Jun. 27, 1995

[54] MONOLITHIC DOUBLE BALANCED MICROSTRIP MIXER WITH FLAT CONVERSION LOSS

[75] Inventor: Virender K. Sadhir, Roanoke, Va.

[73] Assignee: ITT Corporation, New York, N.Y.

[21] Appl. No.: 165,355

[22] Filed: Dec. 10, 1993

[51] Int. Cl.$^6$ ............................................. H0HB 1/26
[52] U.S. Cl. ........................... 455/326; 455/327; 455/330; 455/333; 333/26
[58] Field of Search ............... 455/326, 327, 330, 333; 333/26, 100, 125, 136

[56] References Cited

U.S. PATENT DOCUMENTS 4,306,311 12/1981 Igarashi .
4,709,410 11/1987 Tajime et al. .
5,060,298 10/1991 Waugh et al. .

OTHER PUBLICATIONS

Pavio et al., Broadband Monolithic Single & Double Ring Active/Passive Mixers, IEEE 1988 Microwave and Millimeter Wave Monolithic Circuits Symposium, 1988.

*Primary Examiner*—Reinhard J. Eisenzopf
*Assistant Examiner*—Doris To
*Attorney, Agent, or Firm*—Arthur L. Plevy; Patrick M. Hogan

[57] ABSTRACT

A double balanced microstrip mixer circuit for a monolithic microwave integrated circuit comprising a diode ring modulator coupled to a first balun for supplying radio frequency signals to the mixer circuit and a second balun for supplying a signal generated locally to the mixer circuit, two outputs leading from the diode ring modulator for providing an intermediate frequency signal, a first pair of circuits coupled between the first balun and the diode ring modulator and a second pair of circuits coupled between the second balun and the diode ring modulator, for enabling broadband frequencies to be applied to the diode ring modulator independent of impedances created by the first and second baluns. The circuit further includes two low pass filters each coupled to one of the two outputs for rejecting unwanted feed through and a in-phase combiner coupled to the low pass filters.

16 Claims, 8 Drawing Sheets

MONOLITHIC DOUBLE BALANCED MICROSTRIP MIXER WITH FLAT CONVERSION LOSS

FIELD OF THE INVENTION

The present invention relates generally a double-balanced mixer circuit, and more particularly to a double-balanced microstrip mixer having flat conversion loss and suitable for use in monolithic microwave integrated circuits (MMICs).

BACKGROUND OF THE INVENTION

A microwave mixer is generally, a three port non-linear microwave device that takes an incoming low level radio frequency (RF) signal and modulates or mixes it with a strong signal from a local oscillator (LO) to produce signal frequencies including the sum, difference (IF) and cross-products of the RF and LO signals. Microwave mixers, therefore, are employed in devices where it is desirable to convert a higher frequency signal to a lower frequency signal including any receiver systems such as: Satellite Communication Receivers; Direct Broadcasting Satellite receivers; Up and Down converters and EW warfare systems; and so forth. The higher frequency signals are converted to lower frequency signals by providing optimum impedances for signal extraction. Microwave mixers are also employed in devices requiring upconverting a low frequency signal to a higher frequency signal. Microwave mixers are incorporated in a plurality of structural schemes including waveguide, microstrip, or coplanar waveguide, depending upon the application in which the mixer is desired to be used.

Early microwave mixers generally consisted of a point-contact diode fabricated by a metal whisker which forms a rectifying junction by contacting the surface of the semiconductor. These mixers, however, were generally insensitive to conversion loss improvements made by correct impedance matching as a result of their high series resistance, and thus significant gains in noise reduction were not realized.

The advent of Schottky barrier diodes, which are fabricated by plating, evaporating, or sputtering a variety of metals on n or p type semiconductor materials to form a rectifying metal-semiconductor junction, have resulted in mixers with lower conversion losses and noise because of their much smaller series resistances. Hence, microwave mixers have evolved into complex circuits that use two, four, or eight Schottky barrier diodes, single and dual gate field effect transistors (FETs) in microwave integrated circuit (MIC) or monolithic microwave integrated circuit (MMIC) technology.

Monolithic microwave integrated circuits (MMIC) are devices wherein all the active and passive circuit elements and associated interconnections of the device are formed either in sire on or within a semi-insulating semiconductor substrate by one or more well known deposition processes. Among the active circuit elements which can be formed on a semiconductor substrate are diode modulators, transistors, and switches.

The double-balanced mixer (DBM), using a quad diode ring (diode ring modulator), is frequently used in the industry. The term "double-balanced" is used to describe the fact that such types of mixers are capable of isolating both the RF signal and the LO signal voltages from the IF signal output. During one-half of the LO cycle, half of the diodes are in a high resistance state and half in a low resistance state. During the remaining half of the LO cycle, the diodes are in the opposite state. Hence, the mixer acts like a symmetrical switch, turning on and off at the LO frequency. This creams a signal at the output that has an average voltage of 0. DBM employs baluns which function to split the input RF and LO signals into two equal amplitude and phase reversed signals which are then applied to the opposite nodes of the quad diode ring. The large signal LO drive mixes with the low level RF signal to generate the required IF signal along with various other cross products.

Generally, prior art broadband DBMs comprise non-planar or special baluns which are not compatible with monolithic microstrip integrated circuits. It is, however, desirable to implement DBMs using MMIC techniques for a number of reasons. These reasons include the fact that MMIC's are fabricated through batch processing which results in potentially low-cost circuits; MMIC's have improved reliability and reproducibility through minimization of wire bonds and discrete components; their small size and weight advances the art of miniaturization; and MMIC's offer circuit design flexibility and multi-function performance on a chip.

The DBM circuit of the present invention allows the employment of standard well known microstrip technology to effectuate a broadband MMIC DBM.

It is well known in the art that conversion loss is an important figure-of-merit with respect to microwave mixers. Conversion loss is defined as the difference between IF output power and RF input power to the mixer. In other words, it is the measure of loss encountered when the RF input signal gets scaled in the frequency or "downconverted". Broadband systems demand linear input vs. output characteristics thus, the mixer must display a good conversion loss flatness over a broad frequency band. Up until now, prior art DBMs implemented as microstrip MMIC have displayed poor conversion loss flatness over a broad frequency band.

It is, therefore, an object of the present invention to provide a double-balanced microstrip mixer circuit configured for use in a monolithic microwave integrated circuit which enables broadband frequencies to be applied to the diode ring modulator independent of the impedances of the baluns and which achieves a flat conversion loss over a broad frequency band.

SUMMARY OF THE INVENTION

In the practice of the present invention, a double balanced mixer circuit comprising a diode ring modulator, a first balun having a first impedance coupled to said diode ring modulator for supplying radio frequency signals to said mixer circuit, a second balun having a second impedance coupled to said diode ring modulator for supplying a signal generated locally to said mixer circuit, at least one output leading from said diode ring modulator for providing an intermediate frequency signal, a first circuit means coupled between said first balun and said diode ring modulator and second circuit means coupled between said second balun and said diode ring modulator, for enabling broadband frequencies to be applied to said diode ring modulator independent of the impedance of said first and second balun. The circuit further includes low pass filter means coupled to said at least one output for rejecting unwanted feed through and combiner means coupled to said low pass filter means for combining intermediate frequency signals received from said low pass filter means. The circuit is implemented as a monolithic microwave integrated circuit although it is contemplated that the circuit can be implemented in other applications as well including hybrid microwave integrated circuits.

DETAILED DESCRIPTION OF THE INVENTION

Figure 1:
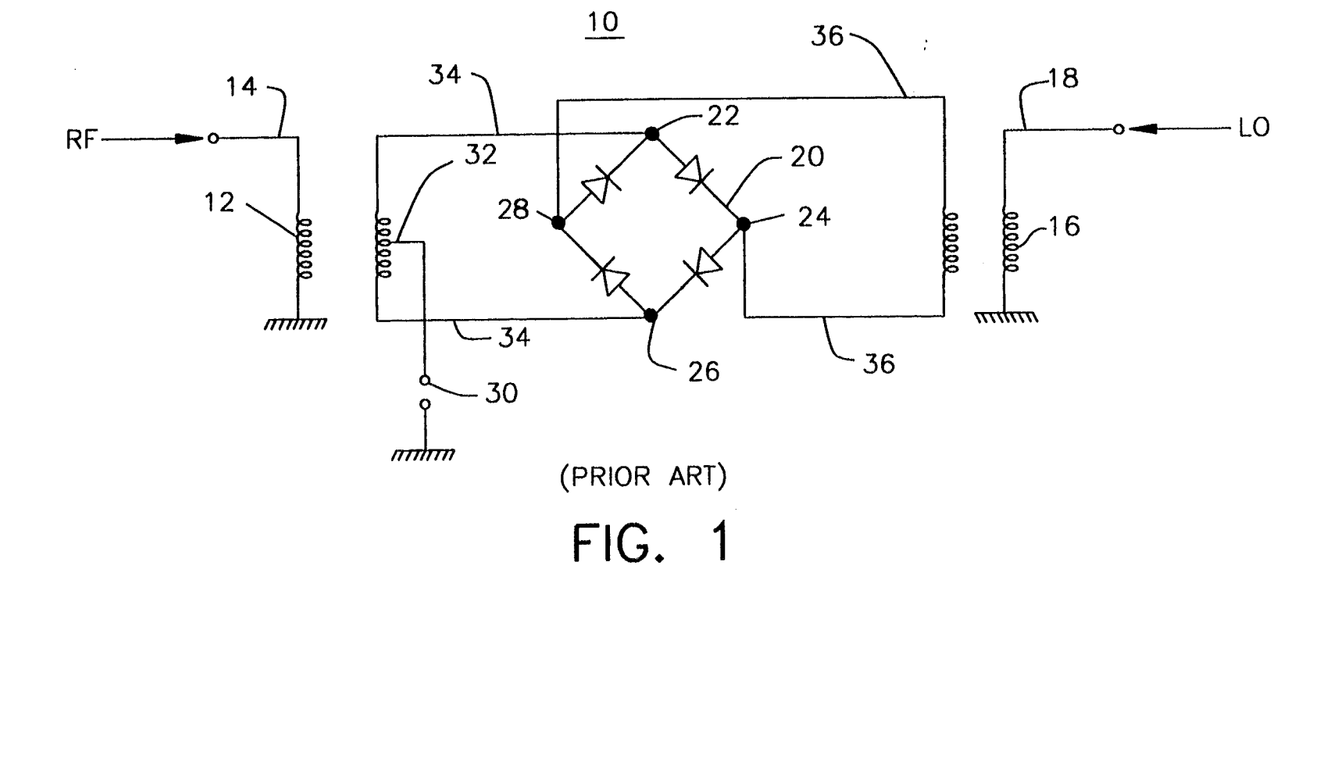
FIG. 1 is a circuit diagram of a prior art double-balanced mixer.

Referring to FIG. 1, there is shown a prior art double-balanced mixer (DBM) circuit denoted by the numeral 10. In this mixer circuit, an unbalanced RF signal is received by first balun 12 at input terminal 14. A large unbalanced LO signal is received by second balun 16 at input terminal 18. The first and second baluns provide the low level RF and large LO signals to mixer 10 in a balanced form by converting the input RF and LO signals into two equal amplitude and phase reversed signals. The output terminals of baluns 12 and 16 apply the signals to opposite nodes 22, 26 and 24, 28 of quad diode ring 20 to generate IF signals at the IF output terminal 30 along with the sum and cross products. The IF signal is provided by tapping the "virtual ground" of the RF balun 12 and provides good IF to RF isolation.

In the DBM as described above, the output reflection coefficient (S22) of both the RF and LO baluns offer a good 50-ohm match to the diode ring at the locations designated by numerals 34 and 36 over the operating RF and LO frequency bands. However, the output reflection coefficient (S22) of both the RF and LO baluns have frequency dependent characteristics. The S22 of the RF balun offers a very broadband "short" over the desired IF frequencies which corresponds to a S22 which approximates unity magnitude with a phase shift of almost |180| degrees. The S22 of the LO balun offers a broadband "open" over the desired IF frequencies which corresponds to a S22 which approximates unity magnitude with a phase shift of almost 0 degrees. Presenting such broadband frequency dependent impedances at the quad diode ring requires additional circuitry between both the RF balun and the quad diode ring and the LO balun and the quad diode ring. The mixer circuit of the present invention includes circuitry which enables broadband frequencies to be applied to the diode ring modulator independent of the impedances of the RF and LO baluns and is described below in detail.

Figure 2:
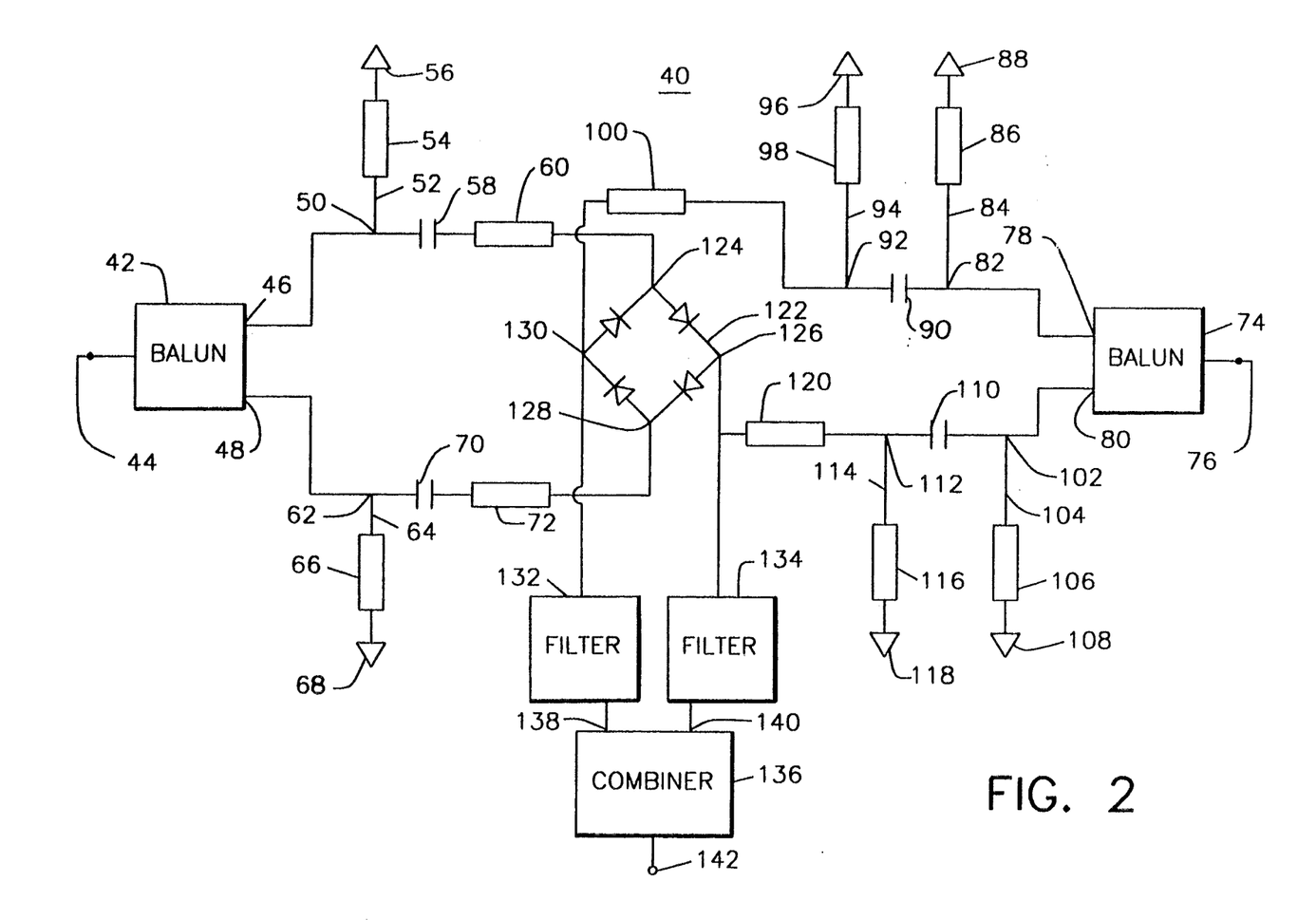
FIG. 2 is a circuit diagram of a preferred embodiment of the present invention.

Referring now to FIG. 2 there is shown a preferred embodiment of the present invention, a double balanced mixer circuit for use in a monolithic microstrip integrated circuit, the circuit being designated by the numeral 40.

Starting on the RF side of the mixer circuit 40, the RF balun 42 is executed using an in-phase WILKINSON divider connected with low-pass and high-pass filter sections consisting of microstrip lines and metal-insulator-metal (MIM) capacitors. It is understood that such baluns are well known in the art. Input terminal 44 of RF balun 42 receives a RF signal. First output terminal 46 of RF balun 42 is coupled to T-junction 50 which has an outgoing shunt path 52. Shunt path 52 comprises a shorted shunt microstrip line 54. Shunt microstrip line 54 can be 55 $\mu$m wide and 1300 $\mu$m long. The output terminal of shunt microstrip line 54 is shorted through via hole 56. A capacitor 58 of 2.2 pF or any other suitable capacitance, is coupled between T-junction 50 and series microstrip line 60. Series microstrip line 60 can be 20 $\mu$m wide and 100 $\mu$m long. The output terminal of series microstrip line 60 is coupled to node 124 of diode ring modulator 122. Second output terminal 48 of balun 42 is coupled to T-junction 62 which has an outgoing shunt path 64. Shunt path 64 comprises a shorted shunt microstrip line 66. Shunt microstrip line 66 is 55$\mu$m wide and 1300 $\mu$m long. The output terminal of shunt microstrip line 66 is shorted through via hole 68. A capacitor 70 of 2.2 pF or any other suitable capacitance, is coupled between T-junction 62 and series microstrip line 72. Series microstrip line 72 can be 20 $\mu$m wide and 100 $\mu$m long. The output terminal of series microstrip line 72 is coupled to node 128 of diode ring modulator 122.

On the LO side of the mixer circuit 40, the LO balun 74 is executed in a well known fashion by inserting a 180 degree long line between one of the two outputs of a Wilkinson divider. Input terminal 76 of LO balun 74 receives a LO signal. First output terminal 78 of LO balun 74 is coupled to T-junction 82 which has an outgoing shunt path 84. Shunt path 84 comprises a shorted shunt microstrip line 86. Shunt microstrip line 86 can be 49$\mu$m wide and 1100 $\mu$m long. The output terminal of shunt microstrip line 86 is shorted through via hole 88. A capacitor 90 of 0.22 pF or any other suitable capacitance, is coupled between T-junction 82 and T-junction 92. T-junction 92 has an outgoing shunt path 94. Shunt path 94 comprises a shorted shunt microstrip line 98. Shunt microstrip line 98 can be 15 $\mu$m wide and 750 $\mu$m long. The output terminal of shunt microstrip line 98 is shorted through via hole 96. A series microstrip line 100 is coupled between T-junction 92 and node 130 of diode ring modulator 122. Node 130 of diode ring modulator 122 is coupled to IF low pass filter 132. The output terminal of IF low pass filter 132 is coupled to the first input terminal 138 of in-phase combiner 136. Second output terminal 80 of balun 74 is coupled to T-junction 102 which has an outgoing shunt path 104. Shunt path 104 comprises a shorted shunt microstrip line 106. Shunt microstrip line 106 can be 49 $\mu$mm wide and 1100$\mu$m long. The output terminal of shunt microstrip line 106 is shorted through via hole 108. A capacitor 110 of 0.22 pF or any other suitable capacitance, is coupled between T-junction 102 and T-junction 112. T-junction 112 has an outgoing shunt path 114. Shunt path 114 comprises a shorted shunt microstrip line 116. Shunt microstrip line 116 can be 15 $\mu$m wide and 750 $\mu$m long. The output terminal of shunt microstrip line 116 is shorted through via hole 118. A series microstrip line 120 is coupled between T-junction 112 and node 126 of diode ring modulator 122. Node 126 of diode ring modulator 122 is coupled to IF low pass filter 134. The output terminal of IF low pass filter 134 is coupled to the second input terminal 140 of in-phase combiner 136. The IF signal is generated at the output terminal 142 of in-phase combiner 136. The low pass filters 132 and 134 act to reject unwanted feed through such as undesired mixing products. The in-phase combiner combines the IF signals passing through the low pass filters 132 and 134.

Figure 3:
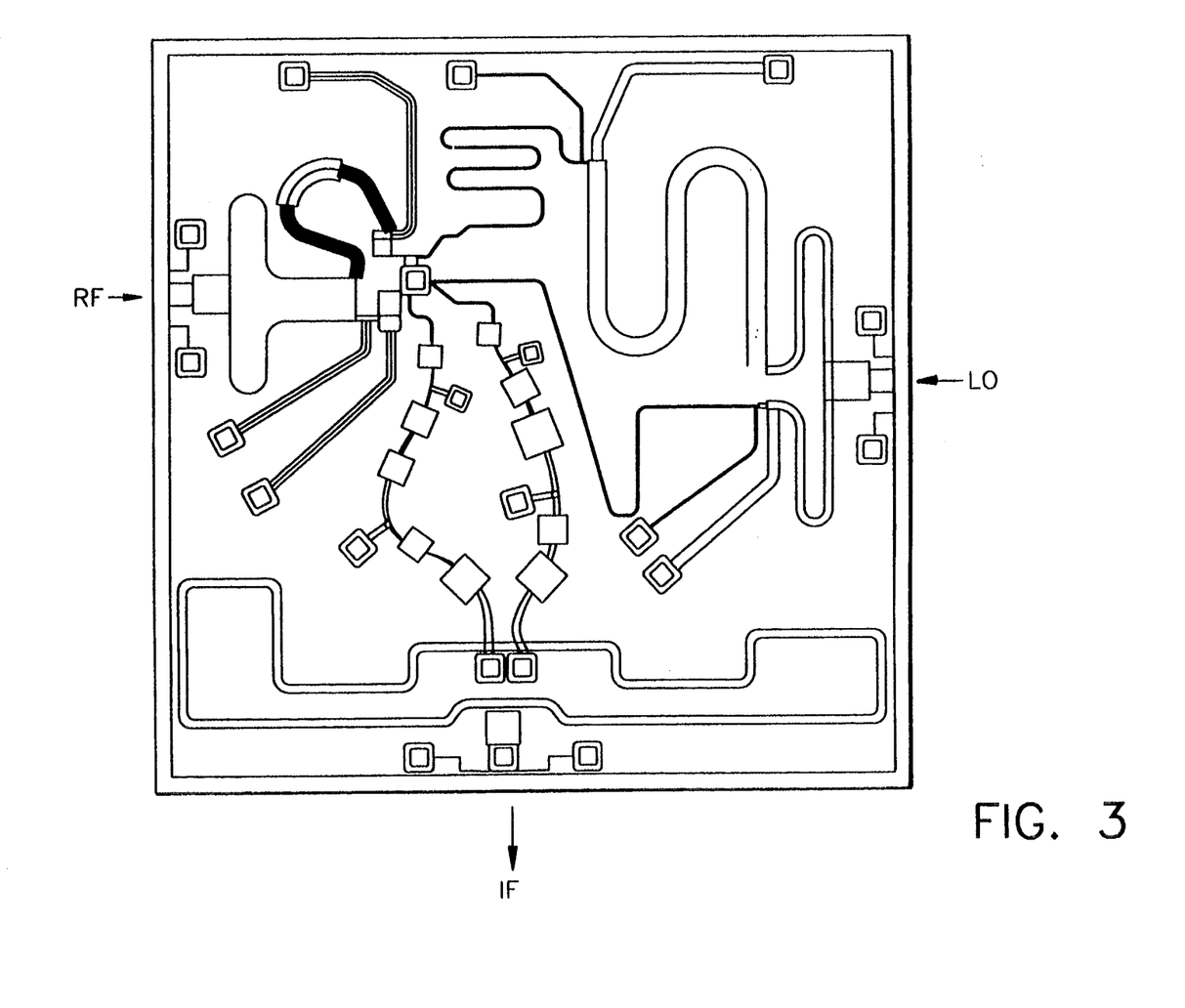
FIG. 3 shows a MMIC incorporating the mixer circuit of the present invention.

The DBM MMIC incorporating the circuitry of the present invention was manufactured on 5-mil thick GaAs using ITT's Multifunctional Self-Aligned Gate (MSAG) process which is well known in the art. FIG. 3 illustrates the layout of this MMIC DBM. The mixer was designed to operate over an input RF frequency bandwidth of 16 to 20 GHz. With the LO frequency set at 14 GHz, the one and a half octave IF frequency bandwidth extended over a 2 to 6 GHz.

Figure 4:
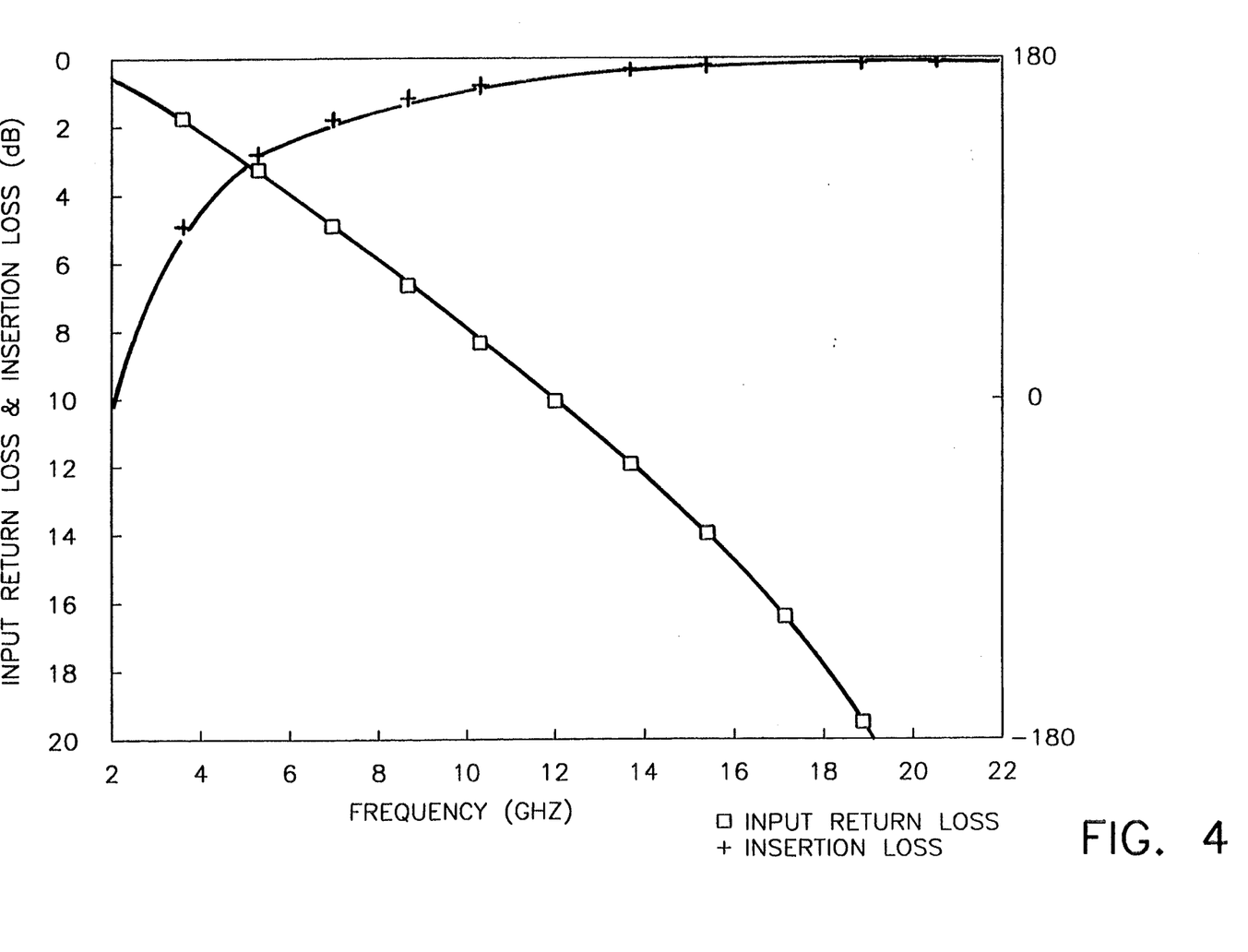
FIG. 4 is a graph showing the input return and insertion loss characteristics of the circuitry coupled between the RF balun and the diode ring modulator.
Figure 5:
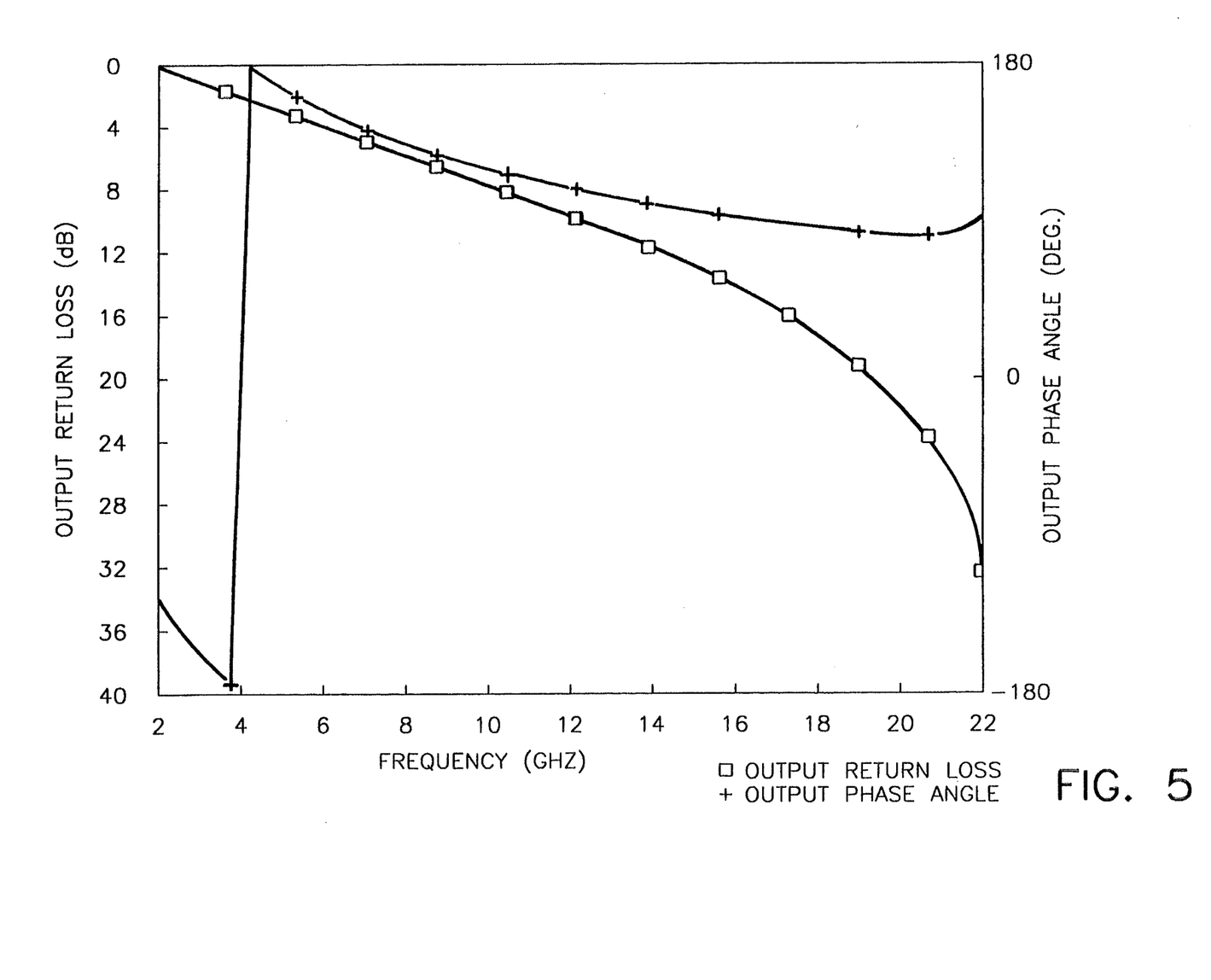
FIG. 5 is a graph showing the output impedance characteristics of the circuit coupled between the RF balun and the diode ring modulator.

FIGS. 4 and 5 show the transmission and reflection characteristics of the circuitry coupling RF balun 42 to diode ring modulator 122. As can be seen in FIG. 4, the circuitry on the RF side exhibits a broadband "rf short" for the IF frequency band (2 to 6 GHz). The output impedance of the RF side circuitry is shown in FIG. 5 wherein the output reflection approximates 0 dB in magnitude and the phase angle approaches |180| degrees over the IF band.

Figure 6:
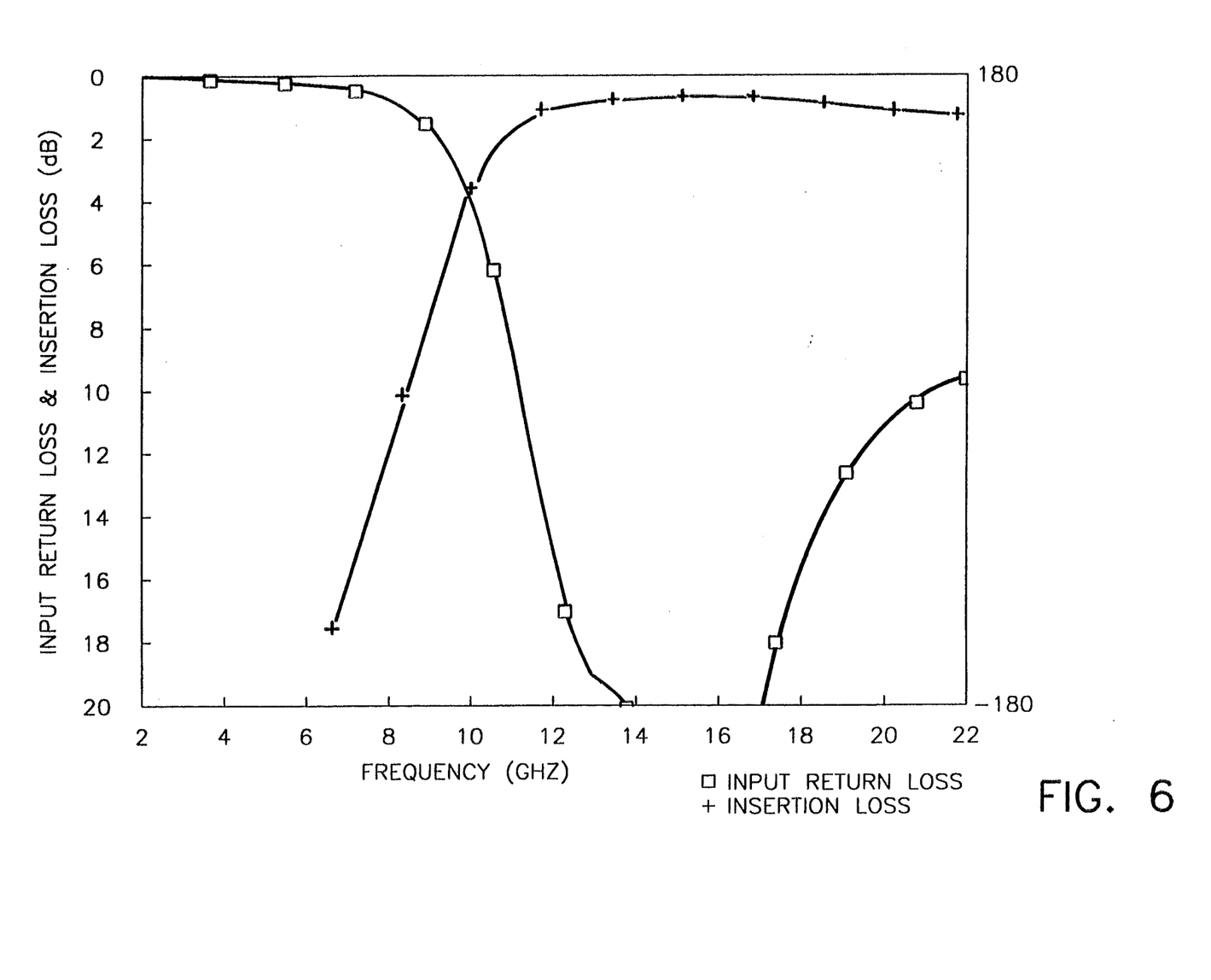
FIG. 6 is a graph showing the input return and insertion loss characteristics of the circuit coupled between the LO balun and the quad diode ring.
Figure 7:
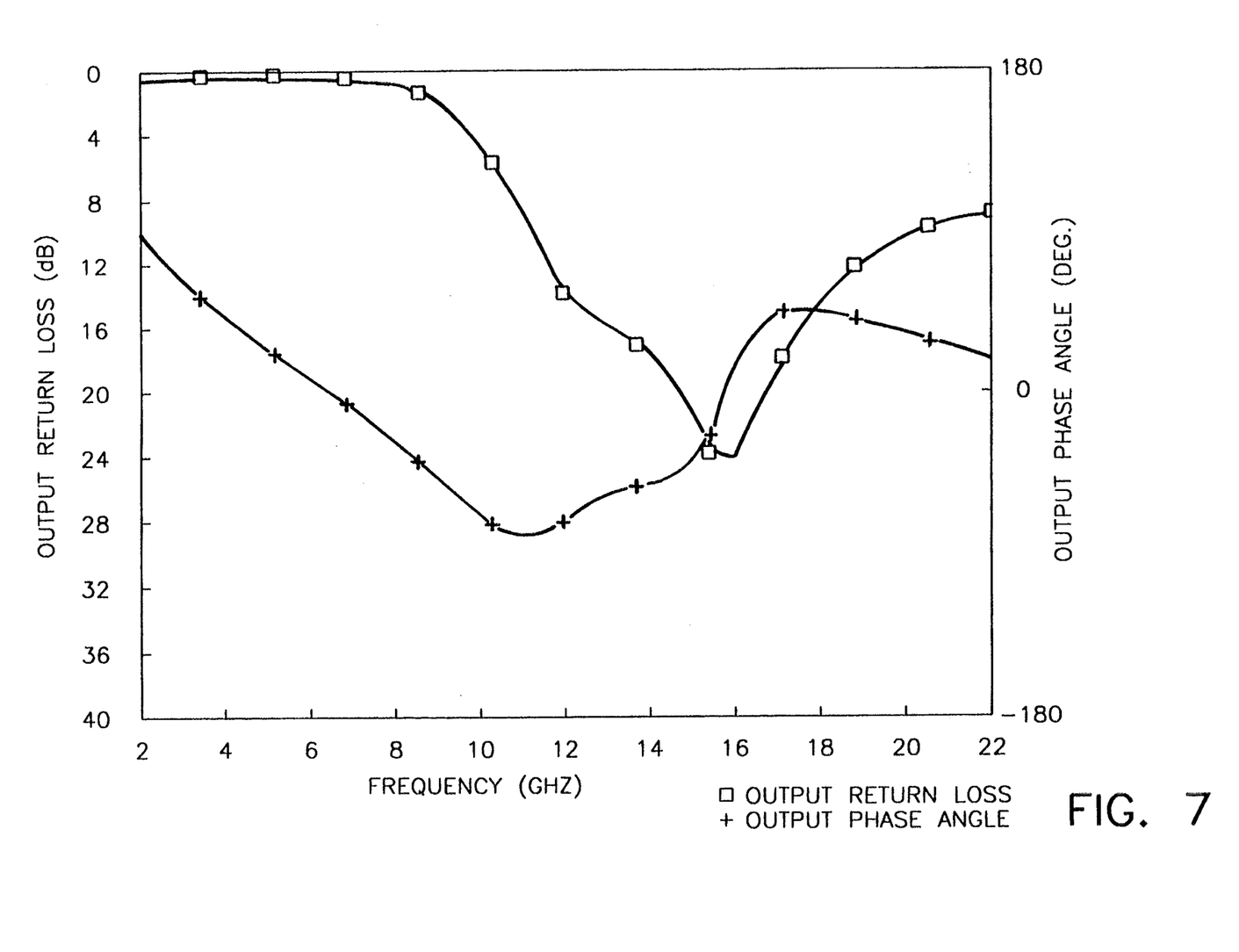
FIG. 7 is a graph showing the output impedance characteristics of the circuit coupled between the LO balun and the diode ring modulator.

The transmission and reflection characteristics of the circuitry coupling LO balun 74 and diode ring modulator 122 can be seen in FIGS. 6 and 7. In FIG. 6 it can be seen that the circuitry on the LO side exhibits input return and insertion loss characteristics to 20 GHz. The output impedance on the LO side as shown in FIG. 7, approximates a broadband "rfopen" for the IF frequencies. The output reflection approximates 0 dB and the phase angle approaches 0 degrees for IF frequency band.

The conversion loss flatness of a DBM MMIC of the present invention is shown below in Table 1.

TABLE 1

| PARAMETER | RESULTS | UNITS |
| --- | --- | --- |
| RF INPUT FREQUENCY | 16–20 | GHz |
| LO INPUT FREQUENCY | 14 | GHz |
| IF OUTPUT FREQUENCY | 2–6 | GHz |
| CONVERSION LOSS | 8.5 | dB |
| CONVERSION LOSS FLATNESS | <±1.0 | dB |
| ISOLATION | | |
| LO TO IF | >40 | dB |
| RF TO IF | >40 | dB |
| ACHIEVED ±0.5 dB CONVERSION LOSS FLATNESS OVER OCTAVE IF BAND | | |

LO INPUT POWER = +18 dBm
RF INPUT POWER = −10 dBm

Figure 8:
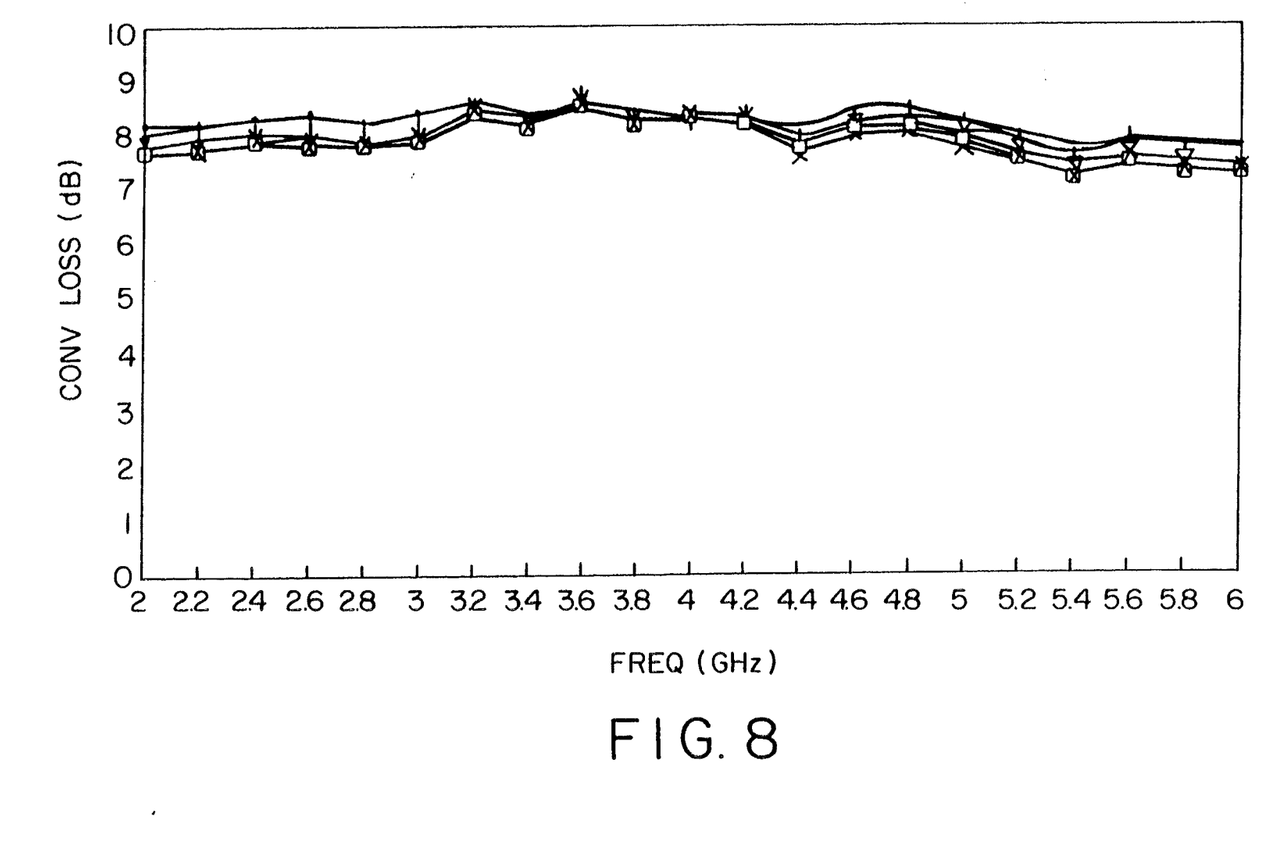
FIG. 8 is a graph showing the measured conversion loss on five dies of a wafer.

With the RF input frequency bandwidth set at 16–20 GHz, the LO input frequency set at 14 GHz and the IF output frequency bandwidth of 2–6 GHz, the measured conversion loss flatness was less than plus or minus one dB over a one and a half octave bandwidth and the conversion loss flatness over a 1 octave bandwidth was less than plus or minus 0.5 dB. FIG. 8 shows the typical measured conversion loss on five dies of the wafer.

It should be understood that the embodiment described herein, including the capacitor values and the widths and lengths of the various microstrip lines, are merely exemplary and that a person skilled in the art may make many variations and modifications to the described embodiment utilizing functionally equivalent elements to those described. Any variations or modifications to the invention described herein are intended to be included within the scope of the invention as defined by the appended claims.

I claim:

1. In a double balanced mixer circuit of the type comprising a diode ring modulator, a first balun having a first impedance coupled to said diode ring modulator for supplying radio frequency signals to said mixer circuit, a second balun having a second impedance coupled to said diode ring modulator for supplying a signal generated locally to said mixer circuit, and at least one output leading from said diode ring modulator for providing an intermediate frequency signal, the improvement comprising:

first circuit means including passive microstrip means for providing a relatively broadband radio frequency short circuit over an intermediate frequency signal band coupled between said first balun and said diode ring modulator and second circuit means including passive microstrip means for providing a relatively broadband radio frequency open circuit over said intermediate frequency signal band coupled between said second balun and said diode ring modulator, for enabling broadband frequencies to be applied to said diode ring modulator independent of the impedance of said first and second baluns.

2. The balanced mixer circuit according to claim 1, wherein said intermediate frequency signal produced at said at least one output includes undesirable mixing products of said radio frequency signals and said signal generated locally and further comprising filter means coupled to said at least one output for rejecting unwanted feed through of said undesirable mixing products and for passing said intermediate frequency signal.

3. The balanced mixer circuit according to claim 2, wherein said at least one output comprises two outputs each producing said intermediate frequency signal and further comprising combiner means coupled to said filter means for combining said intermediate frequency signals which are passed through said filter means.

4. The double balanced mixer circuit according to claim 1, wherein said mixer circuit is implemented as a microstrip monolithic microwave integrated circuit.

5. The balanced mixer circuit according to claim 4, wherein said mixer circuit provides less than plus or minus one dB conversion loss flatness over a one and a half octave intermediate frequency band.

6. The balanced mixer circuit according to claim 5, wherein said mixer circuit provides less than plus or minus 0.5 dB conversion loss flatness over a one octave intermediate frequency band.

7. The double balanced mixer circuit according to claim 1, wherein said mixer circuit is implemented as a hybrid microwave integrated circuit.

8. A double balanced mixer circuit for a monolithic microwave integrated circuit, comprising:

a diode ring modulator;

a first balun coupled to said diode ring modulator for supplying radio frequency signals to said mixer circuit;

a second balun coupled to said diode ring modulator for supplying a signal generated locally to said mixer circuit;

two outputs leading from said diode ring modulator each providing an intermediate frequency signal;

a first pair of circuits each comprising passive microstrip means for providing a relatively broadband radio frequency short circuit over an intermediate frequency signal band, said first circuits being coupled between said first balun and said diode ring modulator; and a second pair of circuits each comprising passive microstrip means for providing a relatively broadband radio frequency open circuit over said intermediate frequency signal band, said second circuits being coupled between said second balun and said diode ring modulator.

9. The balanced mixer circuit according to claim 8, wherein said intermediate frequency signals produced at said two outputs each include undesirable mixing products of said radio frequency signals and said signal generated locally and further comprising filter means coupled to said two outputs for rejecting unwanted feed through of said undesirable mixing products and for passing said intermediate frequency signals.

10. The balanced mixer circuit according to claim 9, further comprises combiner means coupled to said filter means for combining said intermediate frequency signals which are passed through said filter means.

11. The balanced mixer circuit according to claim 8, wherein said mixer circuit provides less than plus or minus one dB conversion loss flatness over a one and a half octave intermediate frequency band when implemented as said monolithic microwave integrated circuit.

12. The balanced mixer circuit according to claim 8, wherein said mixer circuit provides less than plus or minus 0.5 dB conversion loss flatness over a one octave intermediate frequency band when implemented as said monolithic microwave integrated circuit.

13. A double balanced mixer circuit comprising:
a diode ring modulator;
a first balun having a first impedance coupled to said diode ring modulator for supplying radio frequency signals to said mixer circuit;

a second balun having a second impedance coupled to said diode ring modulator for supplying a signal generated locally to said mixer circuit;

two outputs leading from said diode ring modulator each providing an intermediate frequency signal;

a first pair of circuits each comprising passive microstrip means for providing a relatively broadband radio frequency short circuit over an intermediate frequency band, coupled between said first balun and said diode ring modulator; and a second pair of circuits each comprising passive microstrip means for providing a relatively broadband radio frequency open circuit over said intermediate frequency band, coupled between said second balun and said diode ring modulator;

wherein said first and second pair of circuits enable broadband frequencies to be applied to said diode ring modulator independent of the impedance of said first and second baluns.

14. The balanced mixer circuit according to claim 13, wherein said intermediate frequency signal produced at each of said two outputs includes undesirable mixing products of said radio frequency signals, and said signal generated locally and further comprising filter means coupled to said two outputs for rejecting unwanted feed through of said undesirable mixing products and for passing said intermediate frequency signals.

15. The balanced mixer circuit according to claim 14, further comprises combiner means coupled to said filter means for combining said intermediate frequency signals received from said filter means.

16. The balanced mixer circuit according to claim 13, wherein said mixer is implemented as a monolithic microwave integrated circuit which provides less than plus or minus one dB conversion loss flatness over a one and a half octave intermediate frequency band and less than plus or minus 0.5 dB conversion loss flatness over a one octave intermediate frequency band.

* * * * *